United States Patent [19]

Sakaki et al.

[11] Patent Number: 4,553,317
[45] Date of Patent: Nov. 19, 1985

[54] METHOD OF OBTAINING AN IMPACT IONIZATION COEFFICIENT RATE BY JUNCTION OF DIFFERENT KINDS OF SEMICONDUCTORS

[75] Inventors: Hiroyuki Sakaki, 174-260, Ohba-cho, Midori-ku, Yokohama-shi, Kanagawa-ken; Tomonori Tanoue, Odawara; Hidetoshi Nojiri, Matsudo, all of Japan

[73] Assignees: Canon Kabushiki Kaisha, Tokyo; Hiroyuki Sakaki, Kanagawa, both of Japan

[21] Appl. No.: 437,627

[22] Filed: Oct. 29, 1982

[30] Foreign Application Priority Data

Nov. 9, 1981 [JP] Japan ................................. 56-179438
Nov. 9, 1981 [JP] Japan ................................. 56-179439

[51] Int. Cl.$^4$ ........................................... H01L 21/20
[52] U.S. Cl. ........................................ 29/572; 29/584; 148/171; 148/175; 357/4; 357/16
[58] Field of Search ........................ 29/572, 571, 584; 148/175, 171; 357/4, 13, 16

[56] References Cited

U.S. PATENT DOCUMENTS

| 4,103,312 | 7/1978 | Chang et al. | 357/16 |
| 4,137,542 | 1/1979 | Chang et al. | 357/16 |
| 4,194,935 | 3/1980 | Dingle et al. | 357/4 X |
| 4,250,515 | 2/1981 | Esaki et al. | 357/4 X |
| 4,257,055 | 3/1981 | Hess et al. | 357/4 X |
| 4,348,686 | 9/1982 | Esaki et al. | 357/4 X |

OTHER PUBLICATIONS

Herbert Kroemer, "Heterostructure Devices: A Device Physicist Looks at Interfaces", Surface Science 132, (1983), pp. 543-576.
Harrison, W. A., "Elementary Theory of Heterojunctions", J. Vac. Sci. Technol., vol. 14, No. 4, Jul./Aug. 1977.
Sakaki, H., et al., "$In_{1-x} Ga_x As-GaSb_{1-y} As_y$ Heterojunctions by Molecular Beam Epitaxy", Appl. Phys. Letts., vol. 31, No. 3, Aug. 1, 1977.
Tanoue, T., et al., "A New Method to Control Impact Ionization Rate Ratio, etc.", Appl. Phys. Letts., vol. 41, No. 1, Jul. 1, 1982.

Primary Examiner—Brian E. Hearn
Assistant Examiner—Alan E. Schiavelli
Attorney, Agent, or Firm—Fitzpatrick, Cella, Harper & Scinto

[57] ABSTRACT

In a semiconductor element using avalanche multiplication such as a light-receiving element or a microwave oscillating element, a semiconductor A and a semiconductor B which satisfy the following condition:

$$X_A < X_B, X_A + E_{gA} < X_B + E_{gB}$$

where $X_A$ is the electron affinity of the semiconductor A, $E_{gA}$ is the forbidden band width of the semiconductor A, $X_B$ is the electron affinity of the semiconductor B and $E_{gB}$ is the forbidden band width of the semiconductor B, are layered and an electric field is applied in parallelism to the layer, whereby an impact ionization coefficient rate is obtained by junction of the different kinds of semiconductors. At least one of the semiconductors A and B is composed of a mixed crystal comprising three or more elements, and the mole fraction of said one semiconductor is varied to thereby control the value of the impact ionization coefficient rate.

4 Claims, 9 Drawing Figures

METHOD OF OBTAINING AN IMPACT IONIZATION COEFFICIENT RATE BY JUNCTION OF DIFFERENT KINDS OF SEMICONDUCTORS

BACKGROUND OF THE INVENTION

1. Field of the Invention

This invention relates to a method of artificially obtaining impact ionization coefficient rates of electron and hole in a semiconductor element using avalanche multiplication, such as a light-receiving element or a microwave oscillating element.

2. Description of the Prior Art

IMPATT diodes, avalanche photodiodes, etc. are known as elements using the avalanche multiplication by impact ionization. Also, it is known that the operation characteristics such as response speed, noise, sensitivity, etc. of these elements depend on the impact ionization coefficient rate $\alpha/\beta$ of electron and hole created by avalanche multiplication. Substances presently known as ones which cause such impact ionization phenomenon are very much limited semiconductor materials such as, for example, silicon and germanium, and the impact ionization coefficient rate thereof is a value inherent to the substance.

To optimize the operation of the element using said avalanche multiplication, it is necessary to set the impact ionization coefficient rate to a desired value, but the number of kinds of substances which cause the impact ionization is limited as described above. Accordingly, the impact ionization coefficient rates obtainable from the limited substances are also limited and therefore, there often occurs a case where a desired impact ionization coefficient rate cannot be obtained. For example, in avalanche photodiodes, it is known that the noise due to the amplification action during avalanche multiplication is minimum when the impact ionization coefficient rate $\alpha/\beta$ is infinite or zero. FIG. 1 of the accompanying drawings shows a graph in which the abscissa represents the inverse number of the square of the intensity of electric field and the ordinate represents the impact ionization coefficients $\alpha_{si}$ and $\beta_{si}$ of the electron and hole, respectively, of silicon. The impact ionization coefficient rate $\alpha_{si}/\beta_{si}$ of silicon found from FIG. 1 is limited to the order of 4–6. The impact ionization coefficient rate is likewise limited to the order of 2–3 in the case of germanium, and if an avalanche photodiode is formed of these substances, there is a disadvantage of great noise.

SUMMARY OF THE INVENTION

It is an object of the present invention to provide a method of obtaining impact ionization coefficient rates by an artificially arranged substance structure, unlike the existing semiconductor substances having impact ionization coefficient rates.

It is another object of the present invention to provide a method of obtaining impact ionization coefficient rates which could not be obtained from the existing semiconductor substances.

It is still another object of the present invention to provide a method of obtaining impact ionization coefficient rates by the structure of an artificially arranged substance structure, unlike the existing semiconductor substances having impact ionization coefficient rates, and of controlling the value of the impact ionization coefficient rate.

It is yet still another object of the present invention to provide a method of obtaining impact ionization coefficient rates which could not be obtained from the existing semiconductor substances and of controlling the value of the impact ionization coefficient rate.

In one aspect of the present invention, a semiconductor A and a semiconductor B which are different from each other are layered one upon the other and are so arranged that when electrons and holes are flowed in parallelism to the layers, the electrons and holes are spatially separated and move chiefly in the layers of the different semiconductors, whereby an impact ionization coefficient rate is obtained even by the junction of the different kinds of semiconductors. That is, by forming such alternate layers of the semiconductor A and semiconductor B which satisfy the following relation:

$$X_A < X_B, \quad X_A + E_{gA} < X_B + E_{gB} \tag{1}$$

where $X_A$ is the electron affinity of the semiconductor A, $E_{gA}$ is the forbidden band width of the semiconductor A, $X_B$ is the electron affinity of the semiconductor B and $E_{gB}$ is the forbidden band width of the smiconductor B, and by applying an electric field in parallelism to the layers, the above objects are achieved.

Also, at least one of the semiconductors A and B may be composed of a mixed crystal comprising three or more elements and, by varying the mole fraction of this semiconductor, the value of the impact ionization coefficient rate can be controlled.

In another aspect of the present invention, an electric field perpendicular to the layers is produced by introducing an acceptor impurity into the semiconductor A and a donor impurity into the semiconductor B, thereby expediting the inflow of holes and electrons into the layer of the semiconductor A and the layer of the semiconductor B, respectively.

DESCRIPTION OF THE PREFERRED EMBODIMENTS

Figure 1:
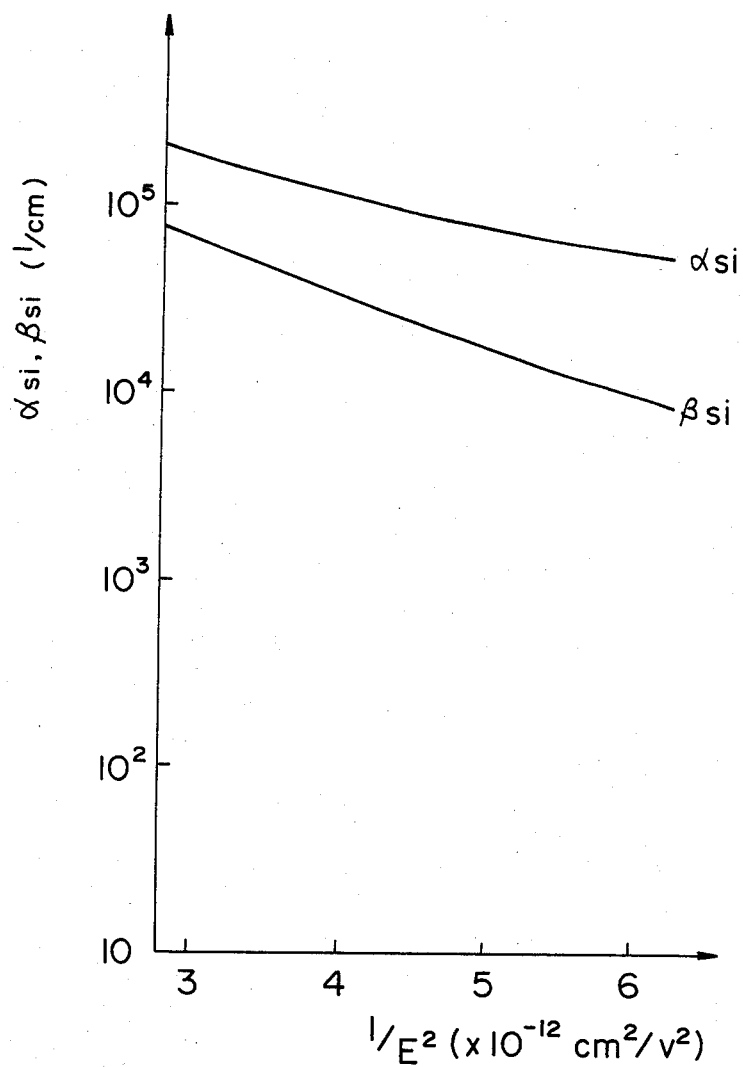
FIG. 1 is a graph showing the impact ionization coefficient rates of the electron and hole in the silicon, according to the prior art, relative to the inverse number of the square of the intensity of electric field.
Figure 2:
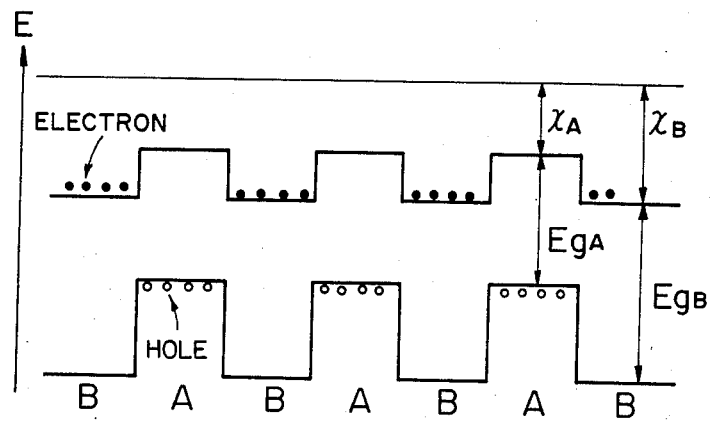
FIG. 2 shows the energy condition in the semiconductor layers formed according to the present invention.

FIG. 2 shows the energy condition in a case where the alternate layers of semiconductor A and semiconductor B which satisfy the formula (1) described in the SUMMARY OF THE INVENTION are formed. In this case, conductive electrons created in the layer of the semiconductor A, by light application, avalanche multiplication, etc., diffuse or fall into the well of the potential of the conductor, namely, into the layer of the semiconductor B, due to the action of the electric field, while holes created in the layer of the semiconductor B fall into the layer of the semiconductor A. As the result, the holes and electrons are respectively separated into the layers of the semiconductors A and B. When the electrons and holes are accelerated in a direction parallel to the layers, namely, in a direction perpendicular to the plane of the drawing sheet in FIG. 2, impact ionization occurs. Assuming that impact ionization coefficients $\alpha$ and $\beta$ can be expressed as $(\alpha_A, \beta_A)$ and $(\alpha_B, \beta_B)$, respectively, in the semiconductors A and B, the impact ionization coefficients of the electrons and holes actually become $\alpha_B$ and $\beta_A$, respectively, due to the aforementioned separating action of the electrons and holes. Accordingly, $\alpha_B/\beta_A$ is obtained as the impact ionization coefficient rate. $\alpha_B$ and $\beta_A$ depend on the applied electric field E as will hereinafter be described, but where the energy obtained when the electrons and holes fall into another layer is great as compared with the forbidden band width $E_g$, the rate $\alpha_B/\beta_A$ is further emphasized in the same electric field.

Figure 3:
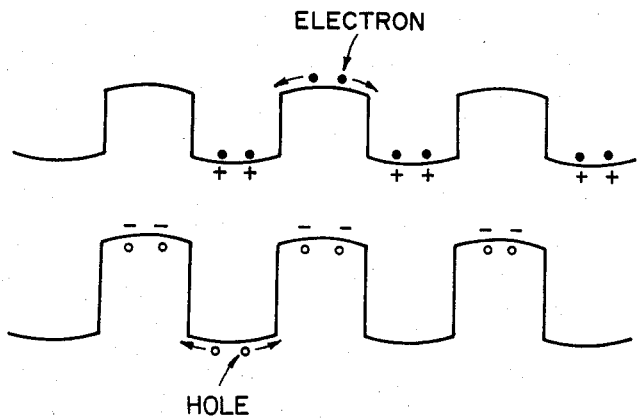
FIG. 3 shows the energy condition when impurities have been introduced into the semiconductor layers, according to the present invention.

FIG. 3 shows the energy condition of the alternate layers formed by the introducing an acceptor impurity into the semiconductor A and a donor impurity into the semiconductor B, according to another aspect of the present invention. By imparting an electric field perpendicular to each layer, the injection of the holes into the layer of the semiconductor A and the electrons into the layer of the semiconductor B is expedited.

Figure 4:
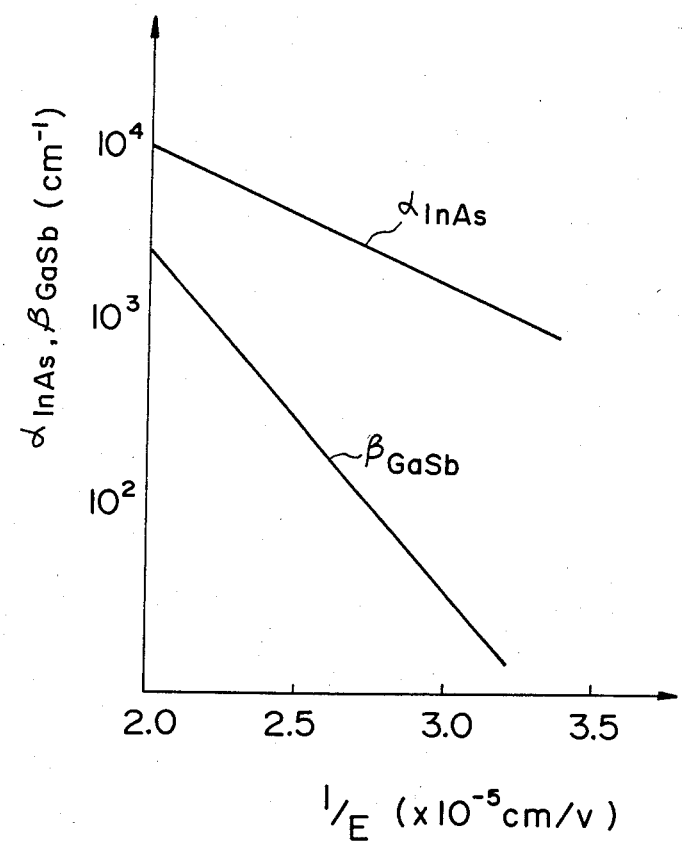
FIG. 4 is a graph showing the impact ionization coefficients of the electron and hole in a first embodiment of the present invention using InAs and GaSb as semiconductors, relative to the inverse number of the intensity of electric field.
Figure 5:
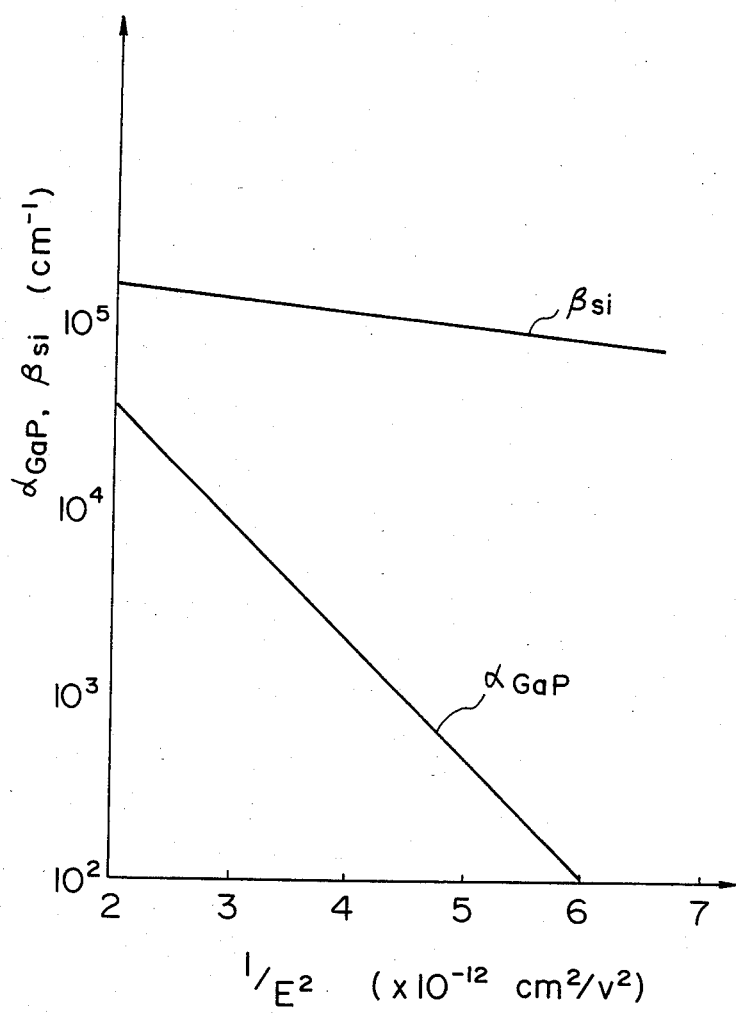
FIG. 5 is a graph showing the impact ionization coefficients of the electron and hole in a second embodiment of the present invention using silicon and GaP as semiconductors, relative to the inverse number of the square of the intensity of electric field.

As the semiconductors of a combination which satisfies the formula (1) in the present invention, there are numerous semiconductors such as the group III–V semiconductors the group IV semiconductors, the group II–VI semiconductors and combinations thereof. Specifically, a combination of InAs and GaSb and a combination of Si and GaP may be mentioned. FIG. 4 shows the dependency of the impact ionization coefficient $\alpha$InAs of the electrons in InAs and the impact ionization coefficient $\beta$GaSb of the holes GaSb, upon the intensity of electric field E. From FIG. 4, it is seen that $\alpha$InAs/$\beta$GaSb is varied with the intensity of electric field, and for example, the $\alpha$InAs/$\beta$GaSb at the intensity of electric field 33(KV/cm) is 56. That is, such a substance which provides the impact ionization coefficient rate found from FIG. 4 can be formed by using a structure in which InAs and GaSb are layered in accordance with the present invention. FIG. 5 shows the dependency of the impact ionization coefficient $\beta$Si of the holes in Si and the impact ionization coefficient $\alpha$GaP of the electrons in GaP upon the intensity of electric field. From this relation, and by using the combination of Si and GaP, a substance having an impact ionization coefficient rate $\alpha/\beta$ of 0.02 is obtained at the intensity of electric field 500 (KV/cm), in accordance with the present invention.

Another aspect of the present invention will now be described. In this aspect, as in the previously described aspect, impact ionization coefficient rates are obtained by layering the semiconductors of a combination which satisfies formula (1) and at least one of the semiconductors A and B is composed of a mixed crystal comprising three or more elements, and the mole fraction of this semiconductor is varied to thereby vary at least one of the impact ionization coefficients $\alpha_B$ and $\beta_A$, thus controlling the value of the impact ionization coefficient rate $\alpha_B/\beta_A$. Again, as the semiconductors of a combination which can be used according to the present aspect, there are numerous semiconductors such as combinations of the group III–V semiconductors, the group IV semiconductors, the group II–VI semiconductors, etc. Specifically, combinations of InAs with $Ga_{1-x}Al_xSb$, $In_{1-x}Ga_xAs$ with InP, $In_{1-x}Ga_xAs_{1-y}P_y$ with InP, and $In_{1-x}Ga_xP$ with $Ga_{1-y}Al_yAs$ may be mentioned.

A case where InAs and $Ga_{1-x}Al_xSb$ are used is shown as an example. As previously described, when InAs and $Ga_{1-x}Al_xSb$ are layered, the impact ionization coefficient rate is found to be $\alpha$InAs/$\beta Ga_{1-x}Al_xSb$ from the impact ionization coefficient $\alpha$InAs of the electrons in InAs and the impact ionization coefficient $\beta Ga_{1-x}Al_xSb$ of the holes in $Ga_{1-x}Al_xSb$. If the mole fraction of $Ga_{1-x}Al_xSb$, i.e., x, is continuously varied, the value of the impact ionization coefficient of the holes changes and the value of the impact ionization coefficient rate $\alpha$InAs/$\beta Ga_{1-x}Al_xSb$ at a predetermined intensity of electric field can be continuously varied. This state is shown in FIG. 6.

Figure 6:
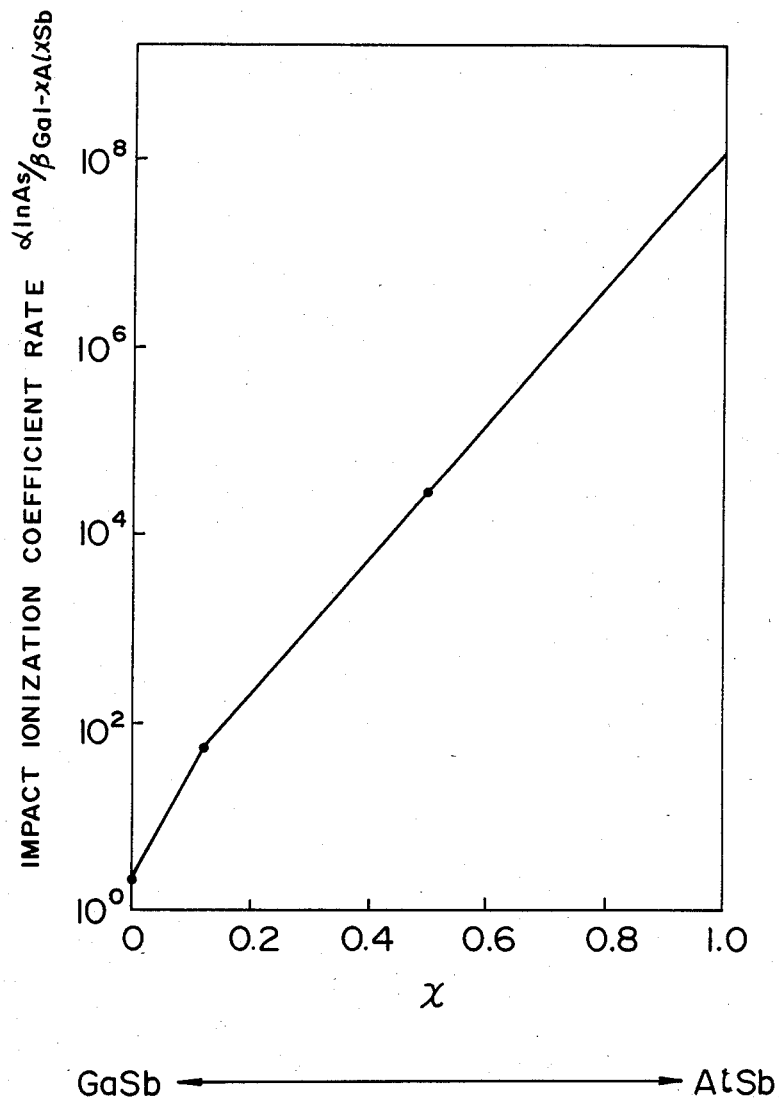
FIG. 6 is a graph showing the impact ionization coefficient rates obtained relative to the mole fraction of $Ga_{1-x}Al_xSb$ in a third embodiment of the present invention using InAs and $Ga_{1-x}Al_xSb$ as semiconductors.

In FIG. 6, the abscissa represents x indicative of the mole fraction of $Al_xGa_{1-x}Sb$ at the intensity of electric field 100(KV/cm) and the ordinate represents the impact ionization coefficient rate $\alpha$InAs/$\beta Ga_{1-x}Al_xSb$ obtained by the method of the present invention. By so selecting the mole fraction of $Ga_{1-x}Al_xSb$, a desired impact ionization coefficient rate of 1.2 to $10^8$ can be obtained at 100(KV/cm).

Figure 7:
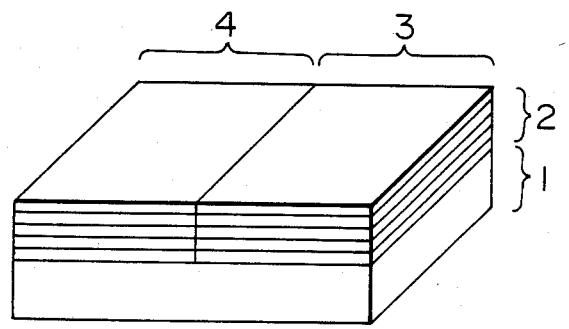
FIG. 7 illustrates a method of making the layered structure of the present invention.

FIG. 7 illustrates a method of making an avalanche photodiode or the like by the present invention and by using InAs and GaSb. In FIG. 7, reference numeral 1 designates a substrate of GaSb or GaAs, reference numeral 2 denotes a grown layer comprising layered InAs and GaSb, reference numeral 3 designates n area, and reference numeral 4 denotes p area. Any of the ordinary epitaxial growth processes such as a liquid phase epitaxy process (LPE), a chemical vapor deposition process (CVD) and a molecular beam epitaxy process (MBE) can be used to make the layered structure. Taking the molecular beam epitaxy process as an example, a substrate of GaSb or GaAs is heated (500°–600° C.) in a vacuum (below $1 \times 10^{-10}$ Torr) and In, Ga, As and Sb are supplied as molecular beams onto the substrate, whereby single crystal thin films of InAs and GaSb are alternately grown in the form of layers. As regards the n area 3 and the p area 4, n type or p type impurity is introduced only into a portion thereof by a selective diffusion process or an ion-implantation process and a p-n junction is formed on the crystal of layer-like structure.

Figure 8A:
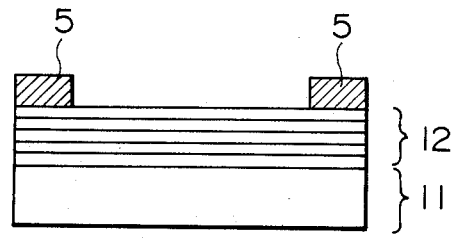
FIGS. 8A and 8B illustrate a method of forming an electrode on a grown layer obtained by the method of the present invention.
Figure 8B:
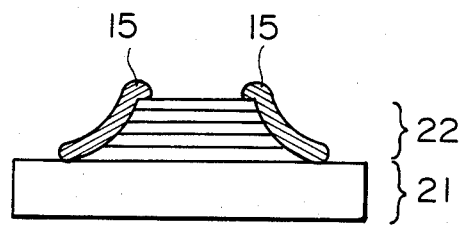

FIGS. 8A and 8B show a method of forming an electrode on a grown layer made by the method of the present invention. In FIGS. 8A and 8B, reference numerals 11, 21 designate a substrate, reference numerals 12, 22 denote a grown layer, and reference numerals 5, 15 designate an electrode. The electrode is formed on the mesa-structure wall surface of the grown layer obtained by subjecting the grown layer surface to mesa-etching as shown in FIG. 8A or by subjecting the grown layer to mesa-etching as shown in FIG. 8B.

Thus, the method of the present invention can be utilized in an element such as an avalanche photodiode using the avalanche multiplication by impact ionization, whereby there can be obtained an element differing in operation characteristics such as response speed, noise, sensitivity, etc. from the conventional element. For example, where an avalanche photodiode is made in accordance with the method of the present invention by using InAs and GaSb, the multiplication noise index is reduced, whereby the element noise is decreased and the minimum detectable power becomes smaller and also, if the noise is of the same magnitude, a great multiplication rate can be taken. Further, the strain of input signal and output signal becomes smaller and the high frequency characteristic is improved.

Further, where mixed crystal comprising three or more elements is used in the present invention, an element having desired operation characteristics such as response speed, noise, sensitivity, etc. can be obtained by controlling the value of the impact ionization coefficient rate.

We claim:

1. A method of obtaining an impact ionization coefficient rate, comprising the steps of:

forming a layer of a semiconductor A and a semiconductor B so that the following conditions are satisfied:

$$X_A < X_B, X_A + E_{gA} < X_B + E_{gB}$$

wherein $X_A$ is the electron affinity of the semiconductor A, $E_{gA}$ is the forbidden band width of the semiconductor A, $X_B$ is the electron affinity of the semiconductor B and $E_{gB}$ is the forbidden band width of the semiconductor B;

irradiating said layer with light to generate holes and electrons;

separating said holes and electrons by diffusion into the layers of the semiconductors A and B, respectively; and applying a direct-current electric field in a direction parallel to said layer to accelerate said holes and electrons in said layers of the semiconductors A and B, respectively, thereby causing avalanche multiplication due to impact ionization, said electric field being provided independently of said irradiating light.

2. A method according to Claim 1, wherein at least one of said semiconductors A and B is a mixed crystal including three or more elements and the value of the impact ionization coefficient rate is controlled by varying the mole fraction of said at least one semicondutor.

3. A method according to claim 1, further comprising the steps of introducing acceptor impurity into said semiconductor A and donor impurity into said semiconductor B, wherein an electric field created thereby in a direction perpendicular to said layer accelerates the separation of said holes and electrons.

4. A method according to claim 2, further comprising the steps of introducing acceptor impurity into said semiconductor A and donor impurity into said semiconductor B, wherein and electric field created thereby in a direction perpendicular to said layer accelerates the separation of said holes and electrons.

* * * * *

UNITED STATES PATENT AND TRADEMARK OFFICE
CERTIFICATE OF CORRECTION

PATENT NO. : 4,553,317

DATED : November 19, 1985

INVENTOR(S) : HIROYUKI SAKAKI, ET AL.

It is certified that error appears in the above-identified patent and that said Letters Patent is hereby corrected as shown below:

Column 2, line 25, change "smiconduc-" to --semiconduc---.

Column 3, line 35, change "width $E_g$," to --width $E_g$,--; and line 48, change "semiconductors the" to --semiconductors, the--.

Column 6, line 22, change "semicondutor" to --semiconductor--; and line 32, change "and electric field" to --an electric field--.

Signed and Sealed this

Second Day of September 1986

[SEAL]

Attest:

DONALD J. QUIGG

Attesting Officer

Commissioner of Patents and Trademarks